(12) United States Patent
Huang et al.

(10) Patent No.: US 11,972,789 B2
(45) Date of Patent: Apr. 30, 2024

(54) MEMORY DEVICE WITH ERROR PER ROW COUNTER (EpRC) PERFORMING ERROR CHECK AND SCRUB (ECS)

(71) Applicant: CHANGXIN MEMORY TECHNOLOGIES, INC., Hefei (CN)

(72) Inventors: Zequn Huang, Hefei (CN); Kai Sun, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 18/365,317

(22) Filed: Aug. 4, 2023

(65) Prior Publication Data

US 2024/0062805 A1    Feb. 22, 2024

Related U.S. Application Data

(63) Continuation of application No. PCT/CN2022/124032, filed on Oct. 9, 2022.

(30) Foreign Application Priority Data

Aug. 17, 2022    (CN) .......................... 202210989367.5

(51) Int. Cl.
*G11C 29/00*    (2006.01)
*G11C 11/4063*    (2006.01)
(Continued)

(52) U.S. Cl.
CPC ...... *G11C 11/4087* (2013.01); *G11C 11/4063* (2013.01); *G11C 29/00* (2013.01); *G11C 29/44* (2013.01); *G11C 29/38* (2013.01)

(58) Field of Classification Search
CPC . G11C 11/4087; G11C 11/4063; G11C 29/00; G11C 29/44; G11C 29/38
See application file for complete search history.

(56) References Cited

U.S. PATENT DOCUMENTS 10,572,341 B2    2/2020 Kwon et al.
10,810,079 B2    10/2020 Halbert et al.
(Continued)

FOREIGN PATENT DOCUMENTS

| CN | 105843699 A | 8/2016 |
| CN | 108630277 A | 10/2018 |

(Continued)

OTHER PUBLICATIONS

International Search Report cited in PCT/CN2022/124032 dated Apr. 20, 2023, 17 pages.

*Primary Examiner* — Mushfique Siddique
(74) *Attorney, Agent, or Firm* — Cooper Legal Group, LLC

(57) ABSTRACT

The present disclosure provides a counter circuit and a memory. The counter circuit includes: a counting circuit configured to output a count value when the count value exceeds a predetermined threshold; a decoding circuit coupled to the counting circuit, and configured to decode the count value to obtain decoding information corresponding to the count value, where the decoding information represents a numerical interval in which the count value is located; and a comparison circuit coupled to the decoding circuit, and configured to compare the decoding information with historical maximum decoding information and latch and output current maximum decoding information.

20 Claims, 9 Drawing Sheets

(51) Int. Cl.
  *G11C 11/408* (2006.01)
  *G11C 29/44* (2006.01)
  *G11C 29/38* (2006.01)

(56) References Cited

U.S. PATENT DOCUMENTS

| | | | |
|---|---|---|---|
| 11,164,651 B2 * | 11/2021 | Song | G11C 7/065 |
| 2012/0284575 A1 | 11/2012 | Foley | |
| 2017/0060681 A1 * | 3/2017 | Halbert | G06F 3/064 |
| 2019/0188072 A1 * | 6/2019 | Kim | G06F 11/104 |
| 2020/0019462 A1 * | 1/2020 | Prather | G11C 7/222 |
| 2023/0065623 A1 * | 3/2023 | Sharma | G11C 29/48 |

FOREIGN PATENT DOCUMENTS

| | | |
|---|---|---|
| CN | 112783686 A | 5/2021 |
| CN | 113808658 A | 12/2021 |

\* cited by examiner

MEMORY DEVICE WITH ERROR PER ROW COUNTER (EpRC) PERFORMING ERROR CHECK AND SCRUB (ECS)

CROSS-REFERENCE TO RELATED APPLICATIONS

This is a continuation of International Patent Application No. PCT/CN2022/124032, filed on Oct. 9, 2022, which claims the priority to Chinese Patent Application No. 202210989367.5, titled "COUNTER CIRCUIT AND MEMORY" and filed with the China National Intellectual Property Administration (CNIPA) on Aug. 17, 2022. International Patent Application No. PCT/CN2022/124032 and Chinese Patent Application No. 202210989367.5 are incorporated herein by reference in their entireties.

TECHNICAL FIELD

The present disclosure relates to the technical field of memories, and in particular, to a counter circuit and a memory.

BACKGROUND

With the development of memory technology, the memory is widely used in various fields, for example, the dynamic random access memory (DRAM) is widely used.

In practical applications, the memory usually needs to have a maximum count function to support the work of the memory. For example, when performing error per row counter (EpRC) in error check and scrub (ECS) in integrated circuit design, it is necessary to always output a result with the maximum number of errors on the basis of a plurality of error count results. Therefore, it is necessary to provide a counter circuit to achieve the above count function.

SUMMARY

Embodiments of the present disclosure provide a counter circuit and a memory.

According to some embodiments, a first aspect of the present disclosure provides a counter circuit. The counter circuit includes: a counting circuit configured to output a count value when the count value exceeds a predetermined threshold; a decoding circuit coupled to the counting circuit, and configured to decode the count value to obtain decoding information corresponding to the count value, where the decoding information represents a numerical interval in which the count value is located; and a comparison circuit coupled to the decoding circuit, and configured to compare the decoding information with historical maximum decoding information and latch and output current maximum decoding information.

According to some embodiments, a second aspect of the present disclosure provides a memory. The memory includes a mode register and the counter circuit as stated above, where the mode register is coupled to the counter circuit and configured to save maximum decoding information outputted by the counter circuit.

BRIEF DESCRIPTION OF THE DRAWINGS

The accompanying drawings incorporated into the specification and constituting part of the specification illustrate the embodiments of the present disclosure, and serve, together with the specification, to explain the principles of the embodiments of the present disclosure.

Specific embodiments of the present application are shown by using the accompanying drawings and are described below in more detail. The accompanying drawings and text description are not intended to limit the scope of the concept of the present application in any manner, but to explain the concept of the present application for those skilled in the art with reference to specific embodiments.

DETAILED DESCRIPTION

Exemplary embodiments are described in detail herein, and examples thereof are represented in the accompanying drawings. When the following descriptions relate to the accompanying drawings, unless otherwise stated, same numerals in different accompanying drawings represent same or similar elements. Implementations described in the following exemplary embodiments do not represent all implementations consistent with the present disclosure. On the contrary, the implementations are merely examples of apparatuses and methods that are described in detail in the appended claims and consistent with some aspects of the present disclosure.

The terms "includes" and "has" in the present disclosure are used to indicate an open-ended inclusion and to mean that additional elements/components/and the like may exist in addition to the listed elements/components/and the like. The terms "first", "second", and the like are merely used as markers or distinctions, not as sequence or quantity restrictions on objects thereof. In addition, the different elements and regions in the accompanying drawings are shown schematically only, and therefore the present disclosure is not limited to the sizes or distances shown in the accompanying drawings.

The technical solution will be described in detail below with reference to specific embodiments. The following specific embodiments may be combined with each other, and the same or similar concepts or processes may not be repeatedly described in some embodiments. The embodiments of the present disclosure will be described in detail below with reference to the drawings.

Figure 1:
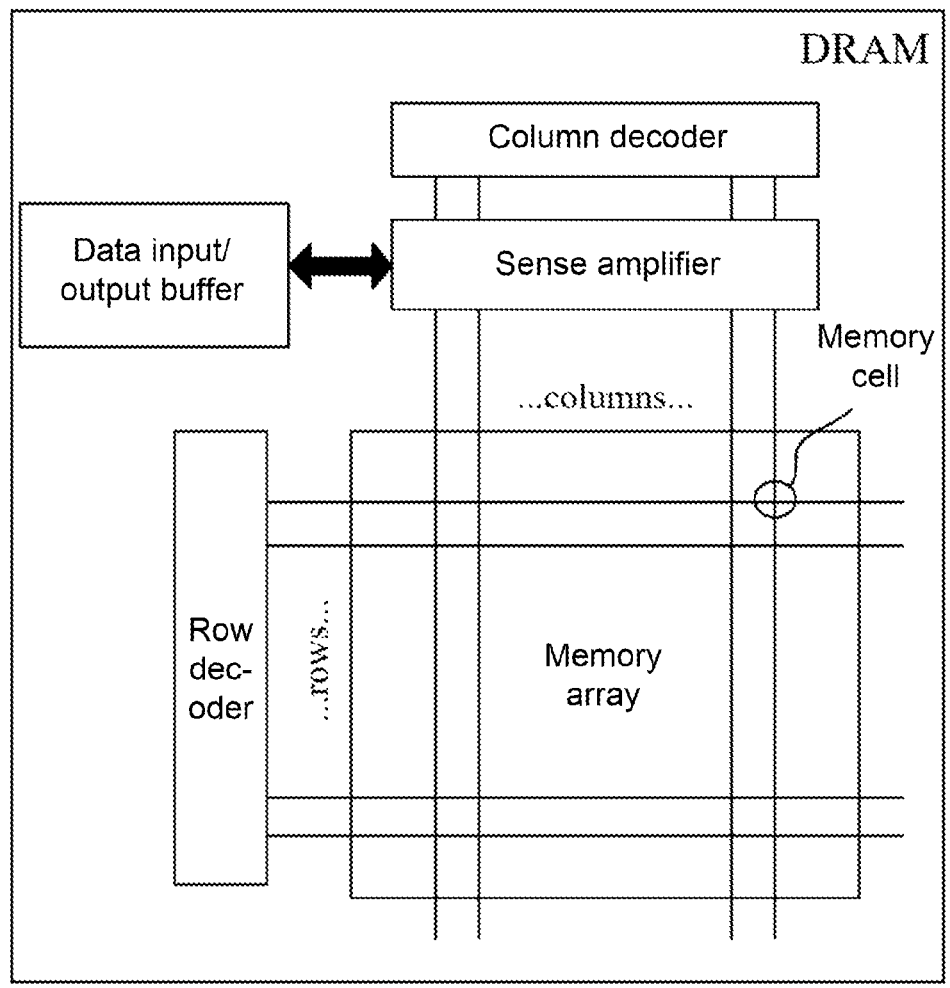
FIG. 1 is a schematic diagram of an architecture of a memory according to an embodiment.

FIG. 1 is a schematic diagram of an architecture of a memory according to an embodiment. As shown in FIG. 1, taking a dynamic random access memory (DRAM) as an example, the memory includes a data input/output buffer, a row decoder, a column decoder, a sense amplifier, and a memory array. The memory array mainly includes word lines, bit lines, and memory cells. The word line in the memory array extends along a row direction, the bit line in the memory array extends along a column direction, and the memory cell in the memory array is at an intersection of the word line and the bit line.

Figure 2:
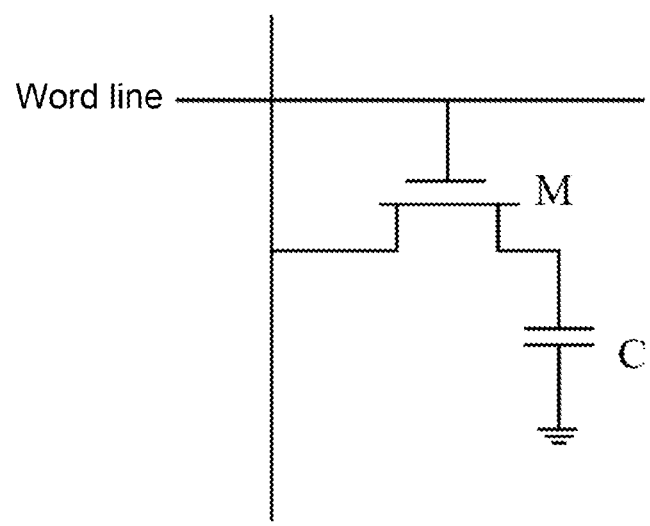
FIG. 2 is a schematic structural diagram of a memory cell according to an embodiment.

Each memory cell is configured to store data of one bit. As shown in FIG. 2, FIG. 2 is a schematic structural diagram of a memory cell according to an embodiment. The memory cell mainly includes a transistor M and a capacitor C. The capacitor is configured to store data, and the transistor is turned off or on according to a state of the word line.

A certain memory cell is activated by controlling a row and a column, to implement access to the memory cell. Taking a reading scenario as an example, when data in the memory cell needs to be read, the word line of a row where the memory cell is located may be selected by a row decoder. Correspondingly, the transistor M shown in the figure is turned on, and a state of the capacitor C can be sensed through sense amplification for a bit line signal. For example, if the data stored in the memory cell is 1, 1 is read from the bit line of the memory cell after the transistor M is turned on, and vice versa. In addition, taking a writing scenario as an example, when data, such as 1, needs to be written into a certain memory cell, the word line of the row where the memory cell is located may be selected by the row decoder. Correspondingly, the transistor M shown in the figure is turned on, and a logic level of the bit line is set to 1, such that the capacitor C is charged, that is, 1 is written into the memory cell. On the contrary, if 0 needs to be written, the logic level of the bit line is set to 0, such that the capacitor C is discharged, that is, 0 is written into the memory cell.

In practical applications, it is necessary to use the maximum count function to support the work of the memory. For example, taking a double data rate synchronous dynamic random access memory (DDR SDRAM) as an example, it is stipulated in the DDR5 JEDEC standard that to improve the capability of a DDR5 DRAM to perform error checking, it is set to perform complete ECS on the memory once at regular intervals, and record address information of a row with the most errors among rows in the memory array and a specific number of errors. As an example, after the memory completes once complete ECS, the address information of the row with the maximum number of errors is stored in a mode register (MR) <16:18> of the memory. As shown in FIG. 1 and FIG. 2, the memory cell is divided into rows and columns inside the memory. An area consisting of the lines and the columns is called a bank (BA). The memory cells in one memory share an addressing unit. Each bank group (BG) includes a plurality of BAs. The address information of the row with the maximum number of errors includes, but is not limited to, BG addresses (BG0-BG2) where the row is located, BA addresses (BA0-BA1) where the row is located, and specific row addresses (R0-R17) of the row. In addition, the maximum number of errors is saved in an MR<19>, and a numerical interval where the maximum number of errors is within is recorded by error counting (REC)<5:0> in the MR<19>. REC <5:0> represents the number of errors within a range, each data bit in REC <5:0> represents a decimal numerical interval, and correspondence thereof is shown in Table 1.

TABLE 1

| Data bit of error counting | Numerica Interval |
|---|---|
| REC<0> | 4~7 |
| REC<1> | 8~15 |
| REC<2> | 16~31 |
| REC<3> | 32~63 |
| REC<4> | 64~127 |
| REC<5> | 128~255 |

Figure 3:
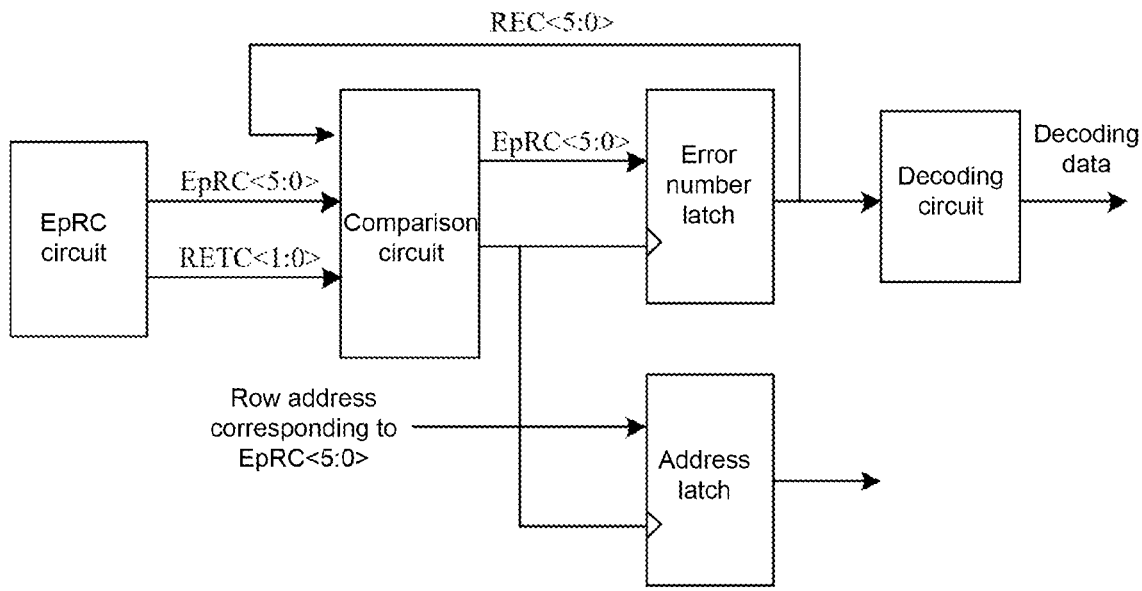
FIG. 3 is a schematic structural diagram of a counter circuit according to an embodiment.

Example of a ECS scenario in DDR5: in actual applications, FIG. 3 is a schematic structural diagram of a counter circuit according to an embodiment. The figure includes an EpRC module configured to perform counting of the number of row errors. Specifically, after the EpRC module detects a plurality of errors on a row, the count value, namely the number of errors EpRC<5:0>, starts to increase, and EpRC<5:0> increases by 1 for each increase in the number of errors by the preset threshold. As an example, the number of errors EpRC<5:0> is counted in binary. Specifically, the EpRC module resets the count value every time the row address changes, such as clearing to zero. The decoding circuit decodes the count value outputted by the EpRC module, and after obtaining the decoding information that can represent the numerical interval in which the count value is located, the comparison circuit compares the decoding information with the historical maximum number of row errors, and records a larger number of errors of the two as the current maximum number of row errors, thereby realizing the counting of the maximum number of row errors.

As shown in FIG. 3, the EpRC module outputs the number of errors (EpRC<5:0>) in the row detected this time, and a signal (RETC<1:0>) indicating whether the number of errors is less than the threshold; and the comparison circuit firstly compares the number of errors (EpRC<5:0>) with the maximum number of errors (REC<5:0>) previously detected in the row, to determine the row address with the current maximum number of errors and the number of row errors. Specifically, after reading all code words in a row each time, the number of errors in the row is compared with the historical maximum number of row errors, and if the historical maximum number of row errors is less than the number of errors in the current row, then the number of errors EpRC<5:0> in the current row and row address information corresponding to EpRC<5:0>, instead of a previous maximum number of errors and row address information, are stored in an error number latch and an address latch. On the contrary, if the number of errors in the current row is less than a number of errors in a previous row, the information of the previous row continues to be stored in the error number latch and the address latch. After that, the decoder decodes the number of row errors in a count value latch to obtain decoded data for recording in the mode register.

In practical applications, to avoid some unnecessary fault corrections, such as the fact that the number of errors is small and does not affect the normal operation of the memory, it is stipulated in the DDR5 JEDEC standard that a row error threshold counter (RETC) can be set. As an example, the RETC may be set to be 4. When the number of row errors is less than the RETC, the count value is not recorded in the mode register. As an example, a thread, namely the RETC, can be set in the embodiment of this solution. Setting the value of the RETC can shield the number of errors less than the RETC. For example, if the checked number of errors does not exceed the RETC, the counting circuit no longer outputs the count value, and correspondingly, subsequent processing does not need to be performed.

Based on the above situation, within the numerical interval represented by REC<0> in REC<5:0>, the minimum value is a value set as the RETC, and the maximum value is 2×RETC-1. Still taking an example where the value of the RETC is 4, the numerical interval represented by REC<0> is 4-7. In addition, for each data bit in REC<5:1>, within the numerical interval represented by each data bit, the minimum value is defined as REC $<X>_{min}=RETC\times2^X$, and the maximum value is defined as REC $<X>_{max}=2\times(RETC\times2^X)-1$, wherein X is a data bit of REC, for example, the data bit of REC<2> is 2. Taking an example where the value of the RETC is 4, as shown in the above table, the numerical interval represented by REC<1> is 8-15, the numerical interval represented by REC<2> is 16-31, the numerical interval represented by REC<3> is 32-63, the numerical interval represented by REC<4> is 64-127, and the numerical interval represented by REC<5> is 128-255. According to which numerical interval the count value outputted by the counting circuit falls in, the REC data bit corresponding to the numerical interval is set to 1. For example, assuming that the count value is 76, which falls within the numerical interval of 64-127, then REC<4> is set to 1, and the remaining data bits REC<3:0> and REC<5> are set to 0. In addition, in the MR, there is one-to-one correspondence between the error count REC<5:0> and the OP<5:0> of the MR<19>. If a data bit in REC<5:0> is 1, the corresponding bit in OP<5:0> of MR<19> is set to 1. On the basis of the above example, OP<4> of MR<19> is set to 1.

Some aspects of the embodiments of the present disclosure relate to the considerations above. Examples of the solution are described below with reference to some embodiments of the present disclosure.

Embodiment 1

Figure 4:
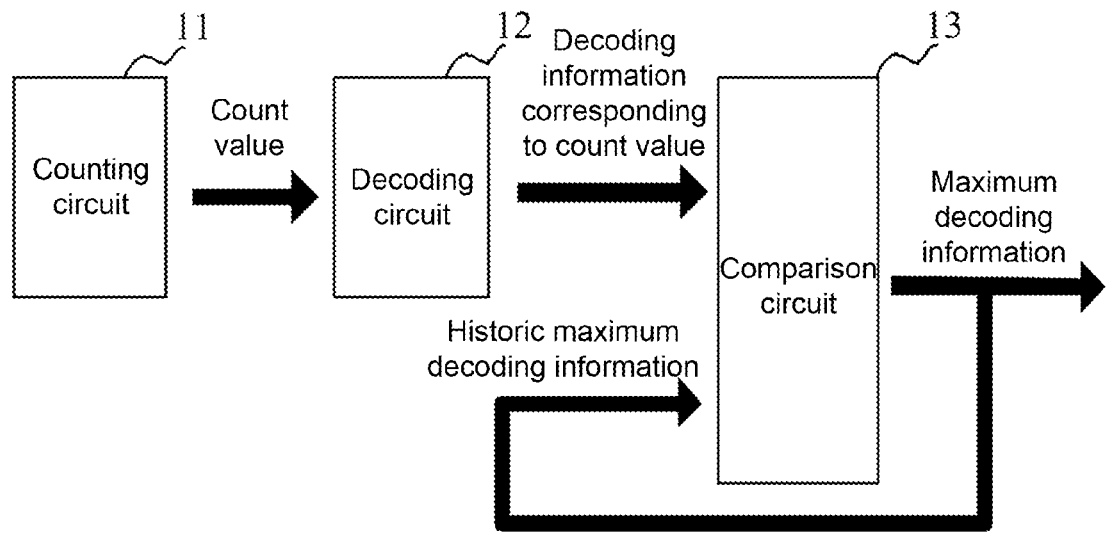
FIG. 4 is a schematic structural diagram of a counter circuit according to an embodiment.

FIG. 4 is a schematic structural diagram of a counter circuit according to an embodiment. As shown in FIG. 4, the counter circuit includes:
- a counting circuit 11, configured to output a count value when the count value exceeds a predetermined threshold;
- a decoding circuit 12, coupled to the counting circuit 11, and configured to decode the count value to obtain decoding information corresponding to the count value, where the decoding information represents a numerical interval in which the count value is located; and
- a comparison circuit 13, coupled to the decoding circuit 12, and configured to compare the decoding information with historical maximum decoding information and latch and output current maximum decoding information.

In actual application, the counter circuit provided in this embodiment may be applied to various memories. For example, the counting circuit may be applied to, including but not limited to, a DDR SDRAM.

As shown in FIG. 4, the counting circuit 11 is responsible for performing counting, and outputting the count value after the counting is completed and if the current counting value exceeds the predetermined threshold. The decoding circuit 12 firstly decodes the count value outputted by the counting circuit 11 to obtain corresponding decoding information, such as OP<5:0>. Specifically, the decoding information represents the numerical interval in which the count value is located. After decoding, the comparison circuit 13 compares the current decoding information with the historical maximum decoding information, such as REG<5:0>, latches the maximum decoding information of the two, and outputs the maximum decoding information as the current historical maximum decoding information. The historical maximum decoding information is the decoding information corresponding to the maximum count value among the count values obtained in history. It should be noted that this is only an example, and it can be understood that there are other possible implementations for the data length of the decoding information, which can be specifically determined according to the needs of counting. In one example, the decoding information is a six-bit binary number. The example may be applicable to an EpRC scenario.

For the fact that the decoding information represents the numerical interval in which the count value is located, in one example, the decoding information is a multi-bit binary number, different bits of the decoding information correspond to different numerical intervals, and a numerical interval corresponding to a high bit is greater than a numerical interval corresponding to a low bit.

For example, each data bit of the decoding information OP<5:0> represents a numerical interval, and OP<5>, OP<4>, OP<3>, OP<2>, OP<1> and OP<0> respectively represent a numerical interval. The numerical intervals represented by each data bit do not overlap, and may form a continuous larger numerical interval. Specifically, the numerical interval represented by the decoding information may be preset, for example, to be applicable to a memory scenario, and may be set with reference to relevant standards of the memory. The numerical interval corresponding to a high bit is greater than the numerical interval corresponding to a low bit. For example, the numerical interval corresponding to OP<5> is the maximum, and the numerical interval corresponding to OP<4> is greater than the numerical interval corresponding to OP<3>. Herein, the size relationship between the numerical intervals is determined according to the numerical range of the numerical intervals. For example, if one numerical interval is 8-15 and the other numerical interval is 16-31, then the latter is greater than the former. By decoding the count value, different bits of the obtained decoding information can represent different numerical intervals, and the numerical intervals do not overlap, to realize that the decoding information represents the numerical interval in which the count value is located, thereby facilitating the subsequent comparison by the comparison circuit.

It should be noted that, to ensure that the decoding information can accurately represent the numerical interval in which the count value is located, in one example, because the numerical intervals represented by different bits of the decoding information do not overlap with each other, the value of only one bit in the decoding information is 1, indicating that the count value corresponding to the decoding information is within the numerical interval corresponding to the bit.

In this example, after the counting circuit outputs the count value, the value of only one data bit in the decoding information decoded by the decoding circuit is 1. In addition, in other scenarios, for example, if the count value obtained by the counting circuit is less than the threshold, and the current count value is not outputted, the decoding circuit does not perform the decoding processing. In actual applications, different bits in the decoding information correspond to different numerical intervals. Therefore, after the count value outputted by the counting circuit is decoded by the decoding circuit, the decoding information having only one data bit of 1 is obtained, and the decoding information can accurately represent the numerical interval in which the count value is located. Specifically, the numerical interval represented by the data bit having a value of 1 in the decoding information is the numerical interval in which the count value is located. In one example, the decoding circuit 12 includes a one-hot decoder.

Compared with the solution shown in FIG. 3, the embodiment solution shown in FIG. 4 has the following main characteristics: firstly, a threshold is set for the output of the count value. That is, when the count value exceeds the threshold, the counting circuit outputs the count value. In addition, in this embodiment, the count value is first decoded to obtain the decoding information that can represent the numerical interval in which the count value is located, and then the decoding information is compared with decoding information corresponding to a historic count value to determine maximum decoding information, and the maximum decoding information is subsequently recorded into a mode register (MR). In the solution of this embodiment, based on the above characteristics, the EpRC module does not need to output a signal (RETC<1:0>) indicating whether the count value is greater than the threshold, thereby reducing the amount of data to be processed. Moreover, since the decoding information only needs to represent the numerical interval in which the count value is located, and there is no need to be aware of the specific value of the count value, it is convenient to adopt more simplified data to represent it. For example, only one bit of the decoding value is 1 to represent the numerical interval in which the count value is located. Therefore, there is no need to compare all bits in the subsequent comparison, thereby simplifying the circuit structure of the comparison circuit.

It can be understood that in the memory scenario, REC<5:0> finally recorded in the MR is configured to determine the numerical interval where the maximum count value is located. That is to say, assuming that there are two count values, even if the values are different, if the two values are within the same numerical interval, the final record content in the MR is the same. Therefore, the solution of this embodiment utilizes the above characteristics of the row error count scenario of the memory, does not compare the magnitude relationship of the specific count value EpRC<5:0>, but firstly decodes to obtain the decoding information, wherein the value of only one bit of the decoding information is 1, and the other bits are all 0, then, compares and records the decoding information. The solution of this embodiment can effectively simplify the circuit structure and reduce the wiring and layout area. Therefore, the solution of this embodiment is especially suitable for the memory scenario.

Figure 5:
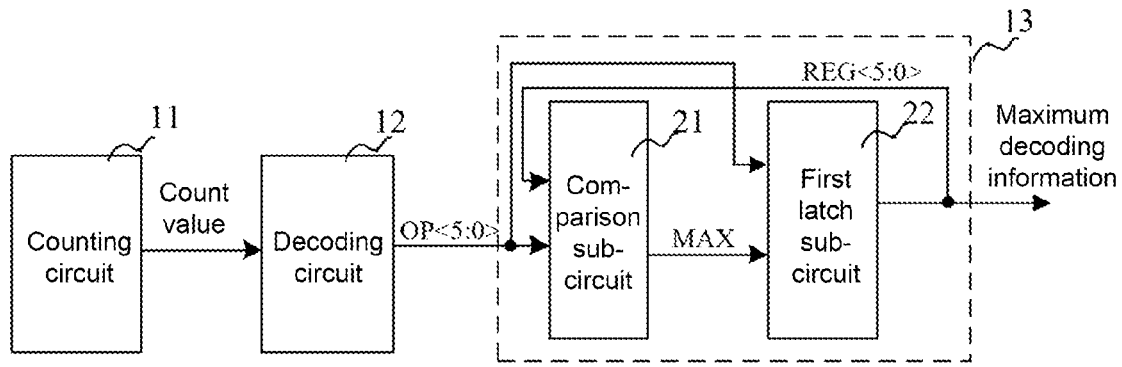
FIG. 5 is a schematic structural diagram of a counter circuit according to an embodiment.

In addition, to compare the decoding information, in one example, FIG. 5 is a schematic structural diagram of a counter circuit according to an embodiment. As shown in FIG. 5, the comparison circuit 13 includes a comparison sub-circuit 21 and a first latch sub-circuit 22.

The comparison sub-circuit 21 has a first input terminal connected to the decoding circuit 12 and a second input terminal connected to an output terminal of the first latch sub-circuit 22, and is configured to compare the decoding information OP<5:0> with the historical maximum decoding information REG<5:0> outputted by the first latch sub-circuit 22 and outputs an enable signal MAX according to a comparison result.

The first latch sub-circuit 22 has an input terminal connected to the decoding circuit 12 and an enable terminal connected to an output terminal of the comparison sub-circuit 21, and is configured to latch and output the current maximum decoding information in response to the enable signal MAX.

In view of the example, when counting for the first time, the historical maximum decoding information REG<5:0> recorded in the first latch sub-circuit 22 is in an initial state, for example, it may be empty or all data bits are 0 by default. The decoding circuit 12 obtains the first decoding information OP<5:0> based on the count value firstly outputted by the counting circuit 11. The comparison sub-circuit 21 compares the decoding information OP<5:0> with the historical maximum decoding information REG<5:0> (REG<5:0> is empty or 0 at this time) currently outputted by the first latch sub-circuit 22. As an example, after the first comparison, it is determined that the decoding information OP<5:0> outputted by the decoding circuit this time is larger than the initial REG<5:0>. Therefore, the comparison sub-circuit 21 outputs a valid enable signal, such as an enable signal MAX in a high-level state. Correspondingly, the first latch sub-circuit 22 performs latch processing in response to the valid enable signal. That is, the decoding information OP<5:0> outputted by the decoding circuit 12 is latched and outputted as new historical maximum decoding information REG<5:0>. That is to say, at this moment, the REG<5:0> outputted by the first latch sub-circuit 22 is consistent with the above decoding information OP<5:0>.

After that, when counting is performed again, the decoding circuit 12 obtains corresponding decoding information OP<5:0> based on the count value outputted by the counting circuit 11 each time and transmits same to the comparison sub-circuit 21. The comparison sub-circuit 21 compares the decoding information OP<5:0> of this time with the decoding information REG<5:0> currently outputted by the first latch sub-circuit 22. If the decoding information OP<5:0> of this time is greater than the current historical maximum decoding information REG<5:0>, the valid enable signal is outputted again to update the REG<5:0> outputted by the first latch sub-circuit 22 to be consistent with the decoding information OP<5:0> of this time. On the contrary, if the decoding information OP<5:0> of this time is not greater than the current historical maximum decoding information REG<5:0>, no valid enable signal is outputted, for example, the enable signal in a low-level state is outputted. Correspondingly, the first latch sub-circuit 22 does not transmit the received decoding information of this time to the inside, and the first latch sub-circuit 22 continues to latch inside and output the historical maximum decoding information REG<5:0>. Subsequently, the above solution is performed for each count value outputted by the counting circuit 11 until the entire counting process ends. For example, when all the EpRC of the memory is completed, the output of the first latch sub-circuit 22 at this time is the maximum count value among all the row error count values.

In one example, the comparison sub-circuit 21 is configured to output a valid enable signal when the decoding information outputted by the decoding circuit 12 is greater than the historical maximum decoding information outputted by the first latch sub-circuit 22, and output an invalid enable signal when the decoding information outputted by the decoding circuit 12 is not greater than the historical maximum decoding information outputted by the first latch sub-circuit 22. The first latch sub-circuit 22 is configured to latch and output, in response to the valid enable signal, the decoding information outputted by the decoding circuit 12, and to maintain to output the historical maximum decoding information in response to the invalid enable signal. As an example, the valid enable signal and the invalid enable signal may be represented by different signal states, such as a high-level state and a low-level state.

In this example, the comparison sub-circuit outputs the enable signal according to a comparison result between the decoding information of this time and the historical maximum decoding information, such that the first latch sub-circuit can choose whether to update the latched decoding information in response to the enable signal, thereby always outputting the current maximum decoding information through a relatively simplified circuit.

Figure 6:
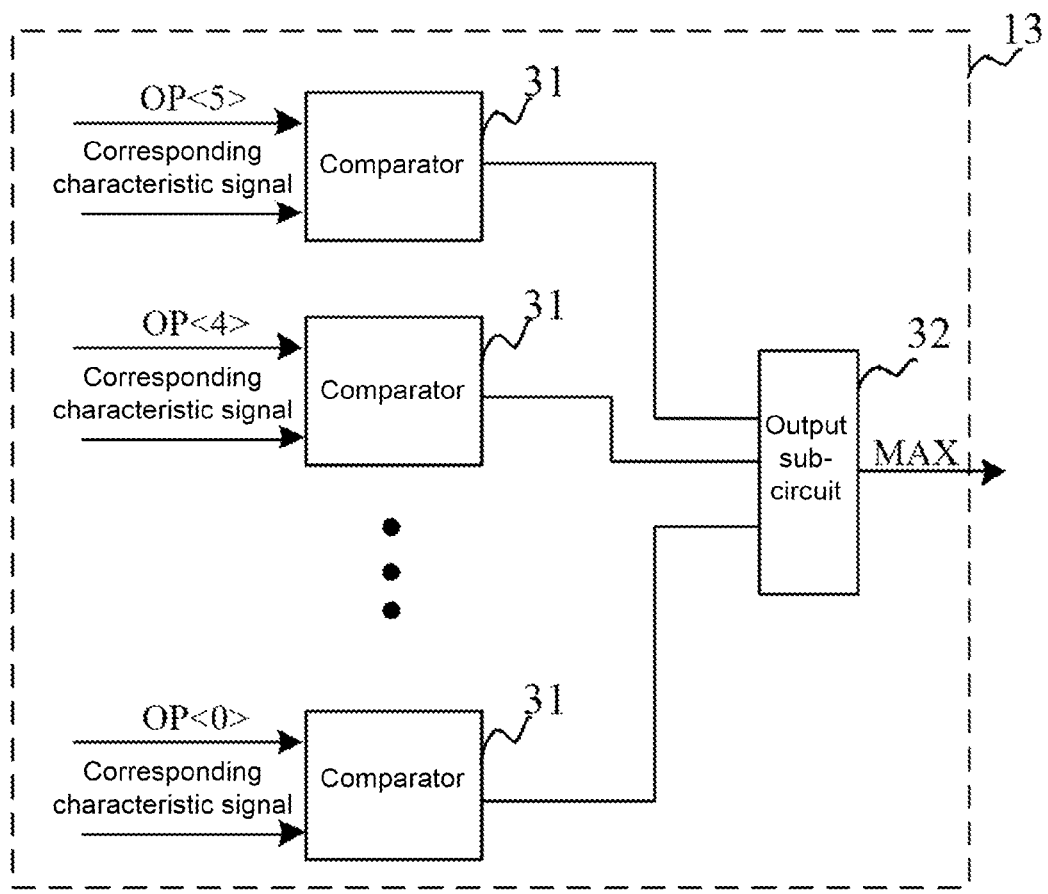
FIG. 6 to FIG. 8 are schematic structural diagrams of a comparison sub-circuit according to an exemplary embodiment.

FIG. 6 is a schematic structural diagram of a comparison sub-circuit according to an embodiment. As shown in FIG. 6, the comparison sub-circuit 21 includes a plurality of comparators 31 and an output sub-circuit 32, where the plurality of comparators are in one-to-one correspondence with bits in the decoding information.

Each of the comparators 31 is configured to receive a corresponding bit signal and a corresponding characteristic signal in the decoding information, and output a result signal according to a comparison result between the bit signal and the characteristic signal, where a value of the characteristic signal indicates whether a bit having a value of 1 and not lower than corresponding bit of the comparison sub-unit 31 exists in the historical maximum decoding information REG<5:0>.

The output sub-circuit 32 is configured to determine and output the valid or invalid enable signal MAX based on the result signal outputted by each of the comparators 31.

The characteristic information inputted into each of the comparators indicates whether a bit having a value of 1 and not lower than the corresponding bit of the comparator exists in the currently recorded historical maximum decoding information. It can be understood that each bit of the decoding information represents a numerical interval, and a higher bit represents a larger numerical interval. In view of the feature that the bit having a value of 1 in the decoding information represents the numerical interval in which the count value is located, by comparing the bits having a value of 1 in the decoding information corresponding to two count values, the magnitude relationship of the two count values can be reflected, to determine the decoding information corresponding to the maximum count value, namely the maximum decoding information. For example, assuming that the decoding information corresponding to a count value A is 000010, and the decoding information corresponding to another count value B is 010000, it can be determined that the count value B is greater than the count value A, and the decoding information corresponding to the count value B is greater than the decoding information corresponding to the count value A.

In this example, the comparators are in one-to-one correspondence with the bits in the decoding information. In view of the example in FIG. 6, taking an example where the decoding information is a six-bit binary number, the six comparators in the figure respectively correspond to six bits in the decoding information. As shown in the figure, the comparators corresponding to OP<5>-OP<0> are included, and each of the comparators receive the corresponding decoding information bit OP< . . . > and the corresponding characteristic signal.

Taking the comparator corresponding to the highest bit as an example, the comparator receives the corresponding bit signal OP<5> and the corresponding characteristic signal. The characteristic signal indicates whether a bit having a value of 1 and being not lower than the corresponding bit (i.e., the highest bit) of the comparator exists in the historical maximum decoding information. The exemplified comparator corresponds to the highest bit of the decoding information. Therefore, the bit being not lower than the highest bit in the historical maximum decoding information is only the highest bit REG<5> of the historical maximum decoding information. Therefore, the characteristic signal received by the exemplified comparator indicates whether the value of the highest bit REG<5> of the historical maximum decoding information is 1.

The decoding information outputted by the decoding circuit and the historical maximum decoding information can be compared through two comparison logics: one is to find the bits of 1 in the two, the bits of 1 in the two are compared, the value of the decoding information having a higher bit of 1 is greater, and if the bits of 1 in the two are the same, it is indicated that the decoding information outputted by the decoding circuit and the historical maximum decoding information are equal; and the other one is to sequentially compare the values of the bits in the two from highest bit to lowest bit, the one having a bit of 1 appears firstly, the value thereof is greater, and if the bits of 1 in the two appear at the same time, the values thereof are equal.

For example, the characteristic signal being 1 may indicate that the bit having a value of 1 and not lower than the corresponding bit of the comparator exists in the historical maximum decoding information; and the characteristic signal being 0 indicates that the bit having a value of 1 and not lower than the corresponding bit of the comparator does not exist in the historical maximum decoding information, that is, the bits not lower than the corresponding bit of the comparator are all 0. Still taking the comparator corresponding to the highest bit as an example, in actual scenarios, the following several situations may appear:

(1) If the highest bit OP<5> of the decoding information outputted by the decoding circuit this time is 1, but the highest bit REG<5> of the historical maximum decoding information is not 1, it can be directly determined that the decoding information outputted this time is greater, so the result signal in a certain state is outputted, such that the output sub-circuit outputs the valid enable signal;

(2) if the highest bit OP<5> of the decoding information is not 1, but the highest bit REG<5> of the historical maximum decoding information is 1, it can be directly determined that the historical maximum decoding information is greater, so the result signal in another state is outputted, such that the output sub-circuit outputs the invalid enable signal;

(3) if both the highest bit OP<5> of the decoding information and the highest bit REG<5> of the historical maximum decoding information are 1, the decoding information outputted by the decoding circuit and the historical maximum decoding information are equal; and (4) if both the highest bit OP<5> of the decoding information and the highest bit REG<5> of the historical maximum decoding information are 0, the maximum decoding information is determined based on the result information of the comparators corresponding to other bits, where the comparison principle of the other comparators is similar to the above. In general, each bit is compared and determined by comparing whether each bit in the decoding information is 1 and whether 1 exists in the same bit and higher bit in the historical maximum decoding information.

Furthermore, the output sub-circuit 32 is controlled based on the result information obtained by comparison to output the valid or invalid enable signal. In one example, if the result signal outputted by any comparator 31 indicates that the value of the bit corresponding to the comparator 31 is 1 and the values of the bits in the historical maximum decoding information not lower than the bit corresponding to the comparator 31 are all 0, the valid enable signal is outputted.

Figure 7:
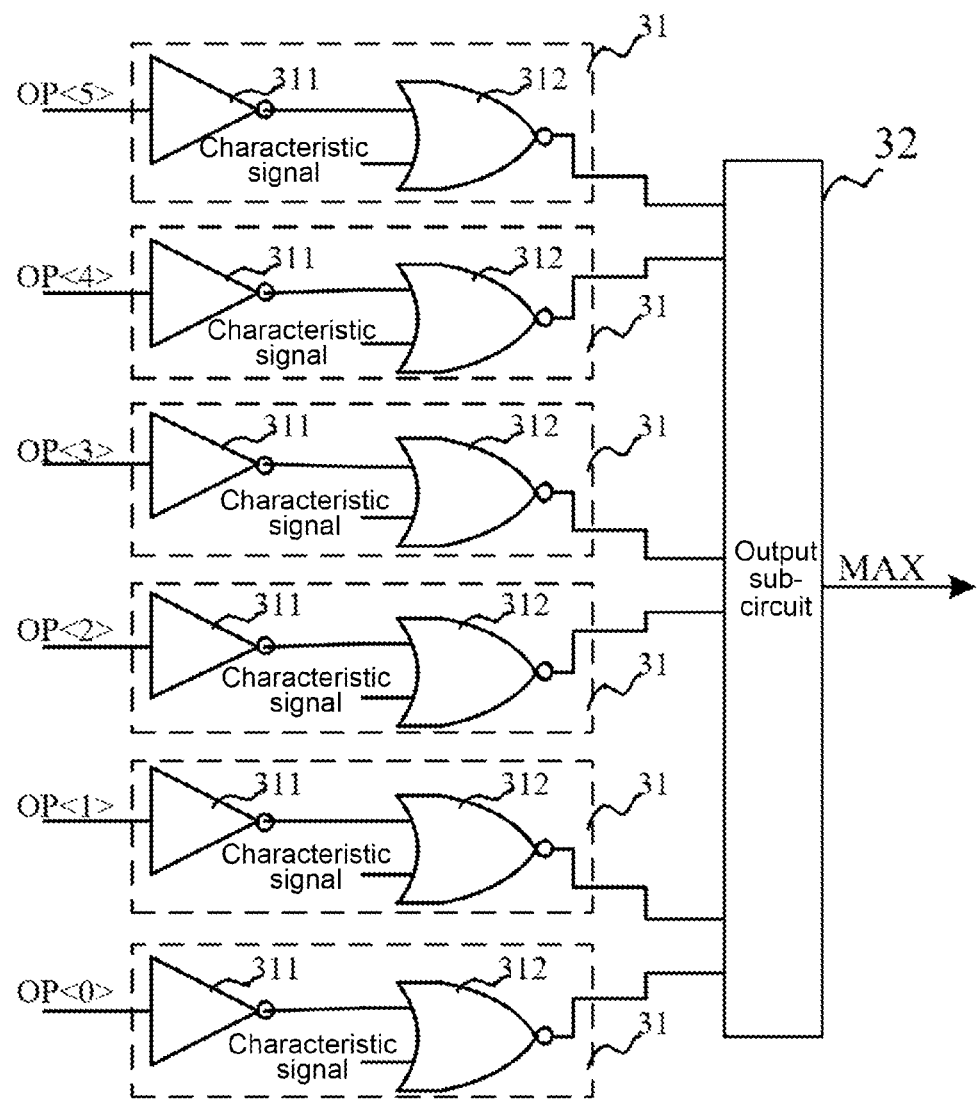

In one example, as shown in FIG. 7, each of the comparators 31 includes a first NOT gate 311 and a first NOR gate 312.

The first NOT gate 311 has an input terminal configured to receive a corresponding bit signal in the decoding information and an output terminal connected to a first input terminal of the first NOR gate 312.

The first NOR gate 312 has a second input terminal configured to receive a characteristic signal corresponding to the comparator 31 and an output terminal connected to the output sub-circuit 32.

Specifically, when the bit information in the decoding information is 1, the first NOT gate 311 outputs 0, and whether the output of the first NOR gate 312 is 1 depends on the characteristic signal. If the characteristic signal indicates that the bits in the historical maximum decoding information not lower than the bit are all 0, for example, the bit signal is 0, the result signal outputted by the first NOR gate 312 is 1, and correspondingly, the output sub-circuit outputs the valid enable signal. When the bit information in the decoding information is 0, the first NOT gate 311 outputs 1. No matter the value of the characteristic signal is 1 or not, the result signal outputted by the first NOR gate 312 is 0, and correspondingly, the output of the output sub-circuit depends on the output situations of other first NOR gates. Only when there is a first NOR gate that outputs 1, it is indicated that the bit signal received by the comparator is 1 and the bits in the historical maximum decoding information not lower than the bit are all 0. That is, it is indicated that the bit having a value of 1 in the decoding information outputted by the decoding circuit is higher than the bit of 1 in the historical maximum decoding information. The decoding information outputted by the decoding circuit is greater than the historical maximum decoding information. It is necessary to update the historical maximum decoding information as the decoding information outputted by the decoding circuit. The output sub-circuit outputs the valid enable signal, or otherwise, outputs the invalid enable signal.

That is to say, for each comparator, only when the bit signal in the decoding information is 1, and the bits in the historical maximum decoding information not lower than the bit are all 0, that is, the bit having a value of 1 in the decoding information is higher than the bit having a value of 1 in the historical maximum decoding information, the result signal of 1 is outputted. Otherwise, for example, the bit having a value of 1 in the decoding information is equal to the bit having a value of 1 in the historical maximum decoding information, or the bit having a value of 1 in the decoding information is lower than the bit having a value of 1 in the historical maximum decoding information, the result signal of 0 is outputted.

This example utilizes the characteristics of the decoding information to realize the comparators through a NOT gate and a NAND gate, and the conventional device structure can effectively simplify the circuit structure and reduce the cost.

In some embodiments, there is one characteristic signal corresponding to each of the comparators. That is, one signal indicates whether a bit having a value of 1 exists in the bits in the historical maximum decoding information not lower than the corresponding bit of the comparator. Specifically, to simplify the circuit structure, the conventional device can realize the comparators. Therefore, to make the characteristic signal adapt to the conventional device, in this example, there is one characteristic signal corresponding to each of the comparators, thereby effectively reducing device input ports and simplifying circuit wiring.

Figure 8:
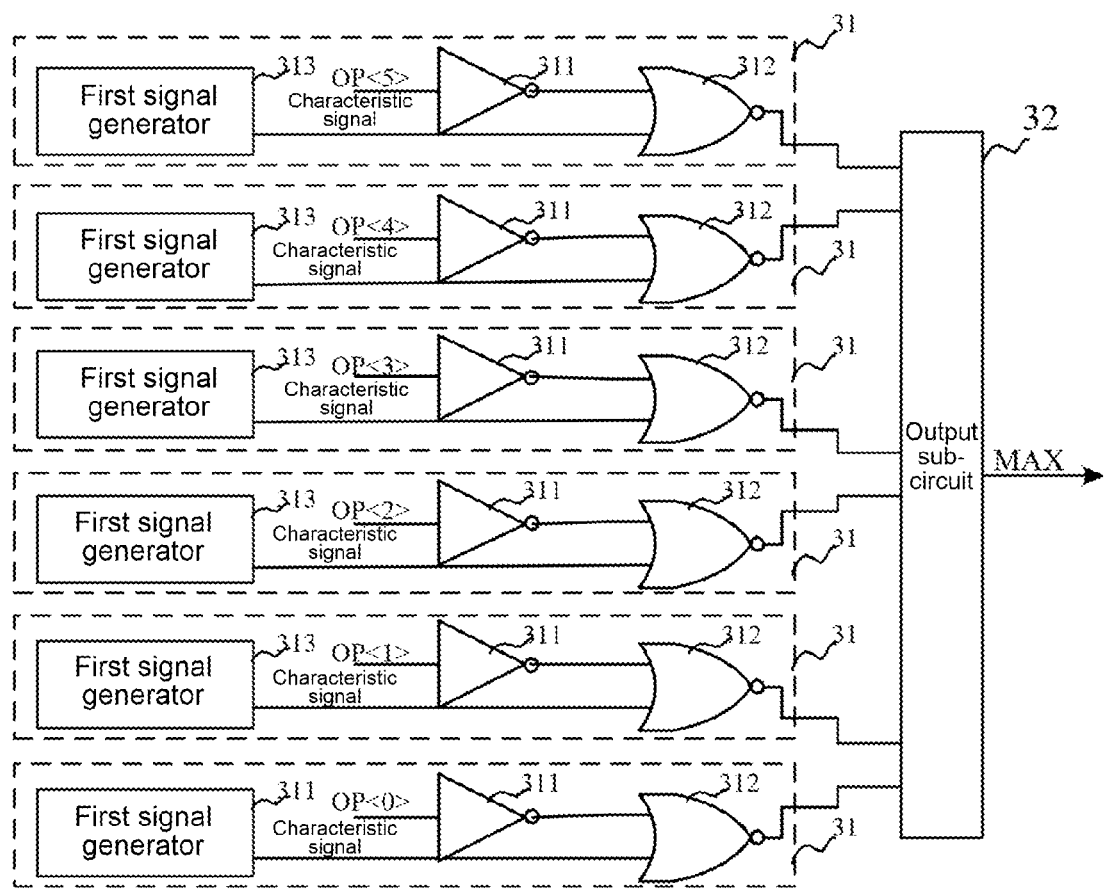

To realize the characteristic signal as a single signal, in one example, as shown in FIG. 8, each of the comparators 31 further includes a first signal generator 313. The first signal generator 313 has input terminals configured to receive all bit signals in the historical maximum decoding information not lower than corresponding bit of the comparison sub-unit 31, and is configured to output a characteristic signal having a value of 1 when a value of any one of the received bit signals is 1.

In this example, each of the comparators corresponds to one of the first signal generators. Each of the first signal generators is configured to generate a characteristic signal inputted into the corresponding comparator, and the first signal generator generates only one characteristic signal. Specifically, the first signal generator is configured to detect whether a bit having a value of 1 exists in all bit signals in the historical maximum decoding information not lower than the corresponding bit of the comparator. For example, all the bits in the historical maximum decoding information not lower than the corresponding bit of OP<3> of the decoding information are REG<5>-REG<3>. Therefore, the first signal generator in the comparator corresponding to OP<3> of the decoding information is configured to detect where a bit having a value of 1 exists in REG<5>-REG<3>. If any bit is 1, the first signal generator outputs 1, or otherwise, the first signal generator outputs 0.

Figure 9:
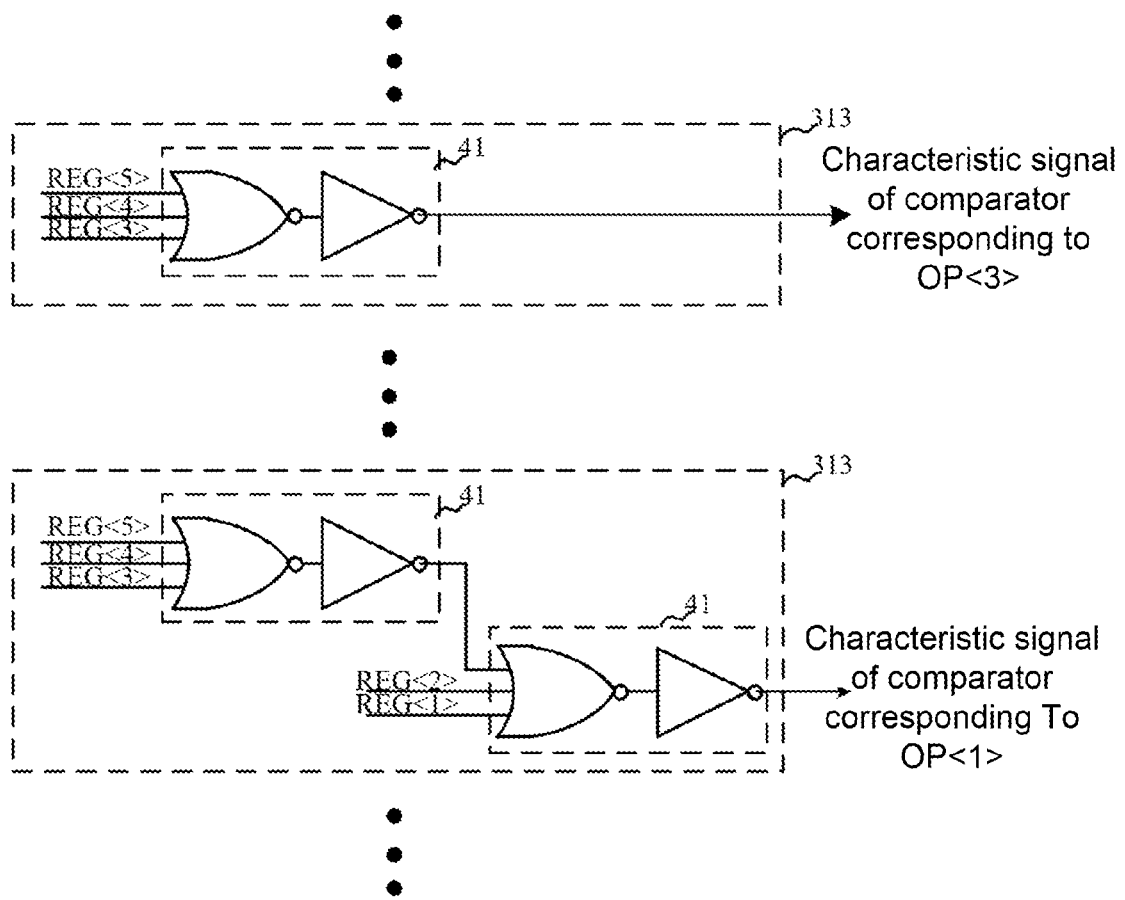
FIG. 9 is a schematic structural diagram of a first signal generator.

Also for the sake of circuit simplification and cost reduction, the conventional device tends to be adopted to realize the first signal generator. As an example, FIG. 9 is a schematic structural diagram of a first signal generator. As shown in FIG. 9, the first signal generator 313 includes at least one first generator 41.

Each of the first generators 41 includes a second NOR gate 411 and a second NOT gate 412, where the second NOR gate 411 has an input terminal as an input terminal of the first generator 41 and an output terminal connected to an input terminal of the second NOT gate 412, and an output terminal of the second NOT gate 412 serves as an output terminal of the first generator 41.

An input terminal of each of the first generators 41 is connected to some or all bits in the historical maximum decoding information not lower than the corresponding bit of the comparator, and a combination result of the bits connected to all the first generators 41 is all the bits in the historical maximum decoding information not lower than the corresponding bit of the comparator.

Each of the first generators 41 other than a first one is connected to an output terminal of the first generator 41 of a previous stage, and the first generator 41 of a last stage outputs the characteristic signal.

The working principle of the above circuit is exemplified with reference to a scenario: taking OP<1> of the decoding information as an example, the combination result of the bits inputted into all the first generators 41 of the first signal generator 313 is all the bits not lower than OP<1>, namely REG<5>-REG<1>, in the historical maximum decoding information. Taking OP<3> of the decoding information as an example, the combination result of the bits inputted into all the first generators 41 of the first signal generator 313 is all the bits not lower than OP<3>, namely REG<5>-REG<3>, in the historical maximum decoding information. There may be one first generator 41, or may be a plurality of first generators 41 according to the number of all the bits not lower than the corresponding bit of the comparator and the number of input terminals of the second NOR gate, which is not limited herein. In the figure, only taking the characteristic signal of the comparator corresponding to OP<1> configured to generate the decoding information as an example, an example is given for the structure of the first signal generator, and the structure of the first signal generator of other comparators is not limited.

For example, the first signal generator 313 corresponding to OP<1> exemplified in the figure includes two first generators 41, where one of the first generators 41 includes input signals of REG<5>-REG<3>, and the other of the first generators 41 includes input signals of REG<2>-REG<1>. In other modes, three first generators 41 may also be provided, where one of the first generators 41 includes input signals of REG<5>-REG<4>, another of the first generators 41 includes input signals of REG<3>-REG<2>, and the last one of the first generators 41 includes an input signal of REG<1>.

It can be seen from the figure that for each of the first generators, only when there is a signal having a value of 1 in the input signals, the second NOR gate outputs 0, and correspondingly, the second NOT gate outputs 1. Since the output of the first generators of previous stages is also taken as the input of the first generators of subsequent stages, if a signal outputted by any first generator is 1, the characteristic signal finally outputted by the first signal generator is 1. Therefore, if it is detected that the value of any bit in all the bit signals in the historical maximum decoding information not lower than the corresponding bit of the comparator is 1, the characteristic signal having a value of 1 is outputted.

In this example, the first signal generator is arranged in each of the comparators to provide one characteristic signal to each of the comparators. The enable signal is outputted based on a result signal after comparison between the characteristic signal and the decoding signal, to update the maximum decoding information.

In some embodiments, at least one of the comparators corresponds to a plurality of characteristic signals. In this example, the number of characteristic signals corresponding to each of the comparators can be determined according to the number of bits that need to be represented by the characteristic signal corresponding to the comparator. For example, assuming that the characteristic signal of a certain comparator (such as the comparator corresponding to OP<5>) needs to represent whether the value of a bit in the historical maximum decoding information is 1, then the number of corresponding characteristic signals is one (such as REG<5>). When the bit corresponding to the comparator is low, and the corresponding characteristic signal needs to represent the value of a bit in the historical maximum decoding information, there may be a plurality of characteristic signals, thereby utilizing a device having a plurality of input ports, and effectively simplifying the circuit structure.

Figure 10:
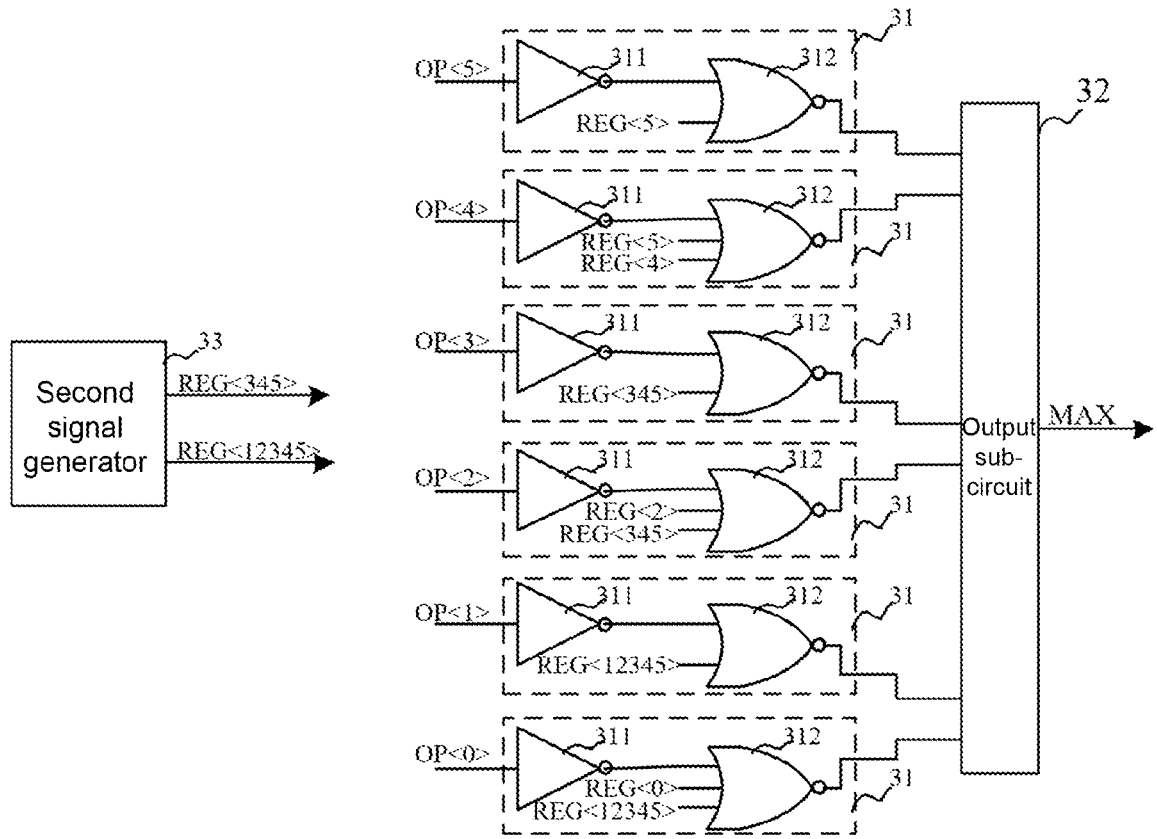
FIG. 10 is a schematic structural diagram of a comparison sub-circuit according to an embodiment.

In one example, as shown in FIG. 10, FIG. 10 is a schematic structural diagram of a comparison sub-circuit according to an embodiment. The comparison sub-circuit 21 further includes a second signal generators 33.

The second signal generator 33 is configured to output a corresponding characteristic signal according to whether a bit having a value of 1 and not lower than a predetermined bit exists in the historical maximum decoding information.

In this example, the second signal generator 33 is responsible for providing the characteristic signals of some comparators. The predetermined bit can be randomly selected. For example, for REG<5:0>, the predetermined bit can be selected as REG<3> and REG<1>. Correspondingly, the characteristic signals outputted by the second signal generator 33 include REG<345> and REG<12345>, where REG<345> indicates whether a bit having a value of 1 exists in the bits in the historical maximum decoding information <5:0> not lower than REG<3>, and REG<12345> indicates whether a bit having a value of 1 exists in the bits in the historical maximum decoding information <5:0> not lower than REG<1>. It should be noted that the scheme in the figure is only one example. In actual applications, any comparator can be directly inputted all the bit signals (as characteristic signals) not lower than the corresponding bit of the comparator.

In one example, the plurality of comparators 31 each includes a first comparator 311 and a second comparator 312. A characteristic signal corresponding to the first comparator 311 includes all bit signals in the historical maximum decoding information not lower than bits corresponding to the first comparator 311. A characteristic signal corresponding to the second comparator 312 includes a signal outputted by the second signal generator 33, where the predetermined bit is a bit corresponding to the second comparator 312 in the decoding information.

As an example, as shown in FIG. 10, for the comparator corresponding to OP<5>, the characteristic signal of the comparator includes REG<5>. For the comparator corresponding to OP<4>, the characteristic signal of the comparator includes REG<4> and REG<5>. For the comparator corresponding to OP<3>, the characteristic signal of the comparator includes REG<345> provided by the second signal generator 33. For the comparator corresponding to OP<2>, the characteristic signal of the comparator includes REG<2> and REG<345> provided by the second signal generator 33. For the comparator corresponding to OP<1>, the characteristic signal of the comparator includes REG<12345> provided by the second signal generator 33. For the comparator corresponding to OP<0>, the characteristic signal of the comparator includes REG<0> and REG<12345> provided by the second signal generator 33.

It should be noted that the above is only an example. It can be understood that the predetermined bit can be selected according to actual situations. In view of the above example, in FIG. 10, the first comparator includes a comparator corresponding to OP<5> and a comparator corresponding to OP<4>. The second comparator includes a comparator corresponding to OP<3> and a comparator corresponding to OP<1>. In the above example, the second signal generator provides the characteristic signals of some of the comparators by setting the predetermined bit. In terms of the feature that some devices have a plurality ports, the comparator having sufficient ports can be directly connected to all the bit signals in the historical maximum decoding information not lower than the bits corresponding to the comparator, and the comparator having limited ports can adopt the characteristic signal provided by the second signal generator. There is no need to generate a special characteristic signal for each comparator, thereby simplifying the structure of the second signal generation circuit, and reducing the overall circuit complexity.

In one example, the plurality of comparators 31 each includes a third comparator 314.

A characteristic signal corresponding to the third comparator 313 includes the signal outputted by the second signal generator 33 and bit signals in the historical maximum decoding information corresponding to the third comparator 313, where the predetermined bit is a higher bit adjacent to a bit in the decoding information corresponding to the third comparator 313.

In view of the above example, for the comparator corresponding to the adjacent lower bit of the predetermined bit, for example, when the predetermined bit is REG<3>, the adjacent lower bit of the predetermined bit is REG<2>. Therefore, for the comparator corresponding to REG<2>, the characteristic signal received by the comparator includes a signal, namely REG<2>, of the bit in the historical maximum decoding information corresponding to the comparator, in addition to including the characteristic signal <345> provided by the second signal generator 33.

In the above example, the characteristic signal provided by the second signal generator and the bit signal in the historical maximum decoding information are combined as the characteristic signal of the comparator, such that the circuit structure of the signal generation unit can be simplified, and the comparator perform comparison on the basis of the characteristic signal and the decoding signal to implement subsequent processing.

Figure 11:
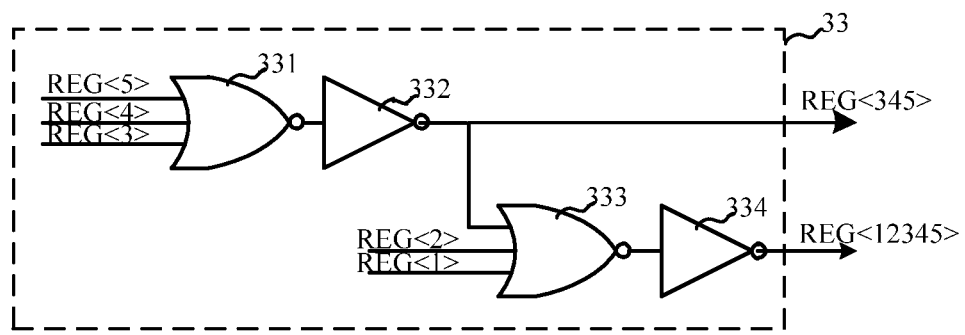
FIG. 11 is a schematic structural diagram of a second signal generator.

The structure of the second signal generation circuit is described below as an example: in one example, FIG. 11 is a schematic structural diagram of a second signal generator. As shown in FIG. 11, still taking an example where the predetermined bit includes REG<3> and REG<1>, the second signal generator 33 includes a second NOR gate 331, a second NOT gate 332, a third NOR gate 333, and a third NOT gate 334.

The second NOR gate 331 has input terminals connected to first three signals REG<5>-REG<3> of the historical maximum decoding information and an output terminal connected to an input terminal of the second NOT gate 332, and an output terminal of the second NOT gate 332 outputs signals REG<345>.

The third NOR gate 333 has input terminals connected to the output terminal of the second NOT gate 332 and bit signals REG<2>-REG<1> in bits in the historical maximum decoding information not lower than the predetermined bit and other than the first three signals, and an output terminal connected to an input terminal of the third NOT gate 334, and an output terminal of the third NOT gate 334 outputs signals REG<12345>.

It should be noted that the above is only an example of the implementation of the structure of the second signal generation circuit. It can be understood that the second signal generation circuit can also be implemented in other possible manners.

In this example, by arranging the second signal generator, the signals of the second signal generator and all bits of the historical maximum decoding information are combined to provide the characteristic signal to each of the comparator. The enable signal is outputted based on a result signal after comparison between the characteristic signal and the decoding signal, to update the maximum decoding information.

Furthermore, for the fact that the output sub-circuit is controlled to output the valid or invalid enable signal according to the result information obtained by comparison, in one example, the output sub-circuit 32 is specifically configured to output the valid enable signal if the result signal outputted by any comparator 31 is a first value, where the first value indicates that the value of the corresponding bit signal in the decoding information received by the comparator 31 is 1 and the values of the bits in the historical maximum decoding information not lower than the bit are all 0.

Optionally, the first value may be 1. As an example, when the result signal outputted by a certain comparator is 1, it is indicated that the value of the corresponding bit of the comparator is 1, and all the bits in the historical maximum decoding information not lower than the bit are 0. The higher the bit of the decoding information, the larger the count value is. Therefore, it can be determined that the decoding information outputted by the decoding circuit is greater than the historical maximum decoding information. When the output sub-circuit detects that any result signal is 1, the valid enable signal is outputted, such that the first latch sub-circuit 22 updates the maximum decoding information as the decoding information outputted by the decoding circuit this time, thereby outputting the current maximum decoding information.

Figure 12:
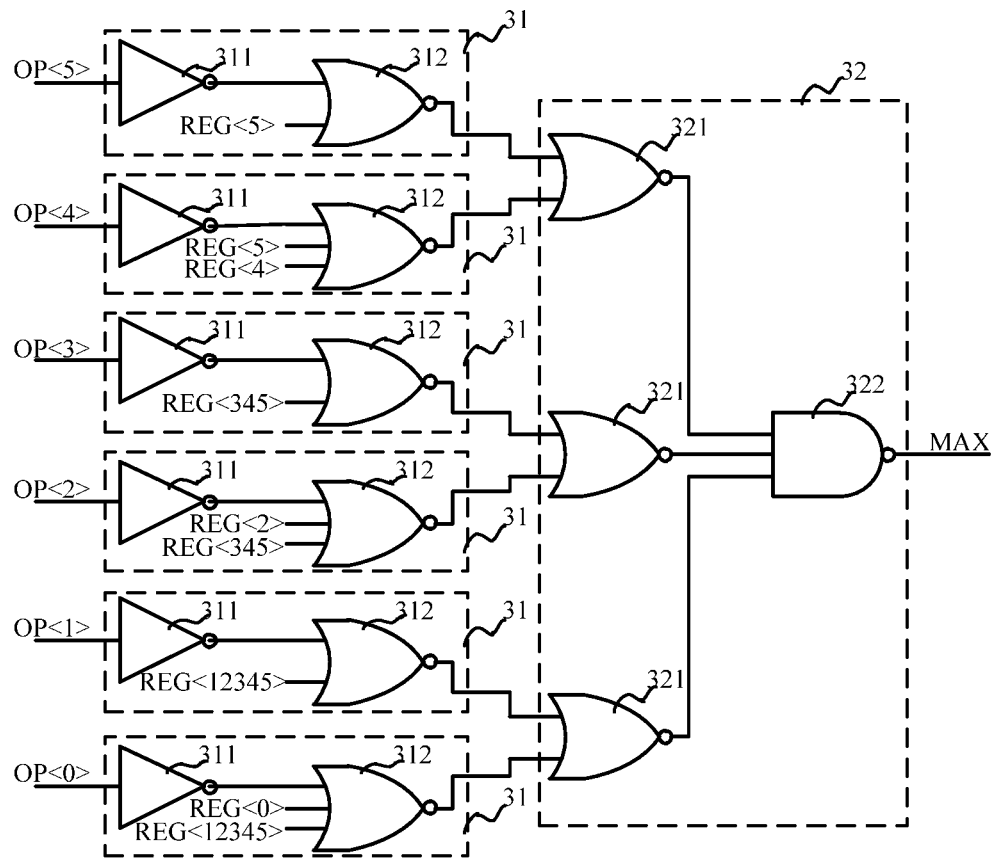
FIG. 12 is a schematic structural diagram of a comparison sub-circuit according to an embodiment.

In one example, FIG. 12 is a schematic structural diagram of an output sub-circuit according to an embodiment. As shown in FIG. 12, the output sub-circuit 32 includes a plurality of fourth NOR gates 321 and a first NAND gate 322. Each of the fourth NOR gates 321 has input terminals respectively connected to output terminals of the comparator 31 corresponding to adjacent bits in the decoding information and an output terminal connected to an input terminal of the first NAND gate 322, and an output terminal of the first NAND gate 322 is configured to output the enable signal. In this embodiment, the NOR gate and the NAND gate of the conventional device are configured to output the valid enable signal when any result signal is detected to be 1, thereby effectively simplifying the circuit and reducing the cost. It should be noted that the scheme in the figure is only one example. The graphic structure of the output sub-circuit can also be implemented in combination with other implementation structures of the comparison sub-circuit.

Figure 13:
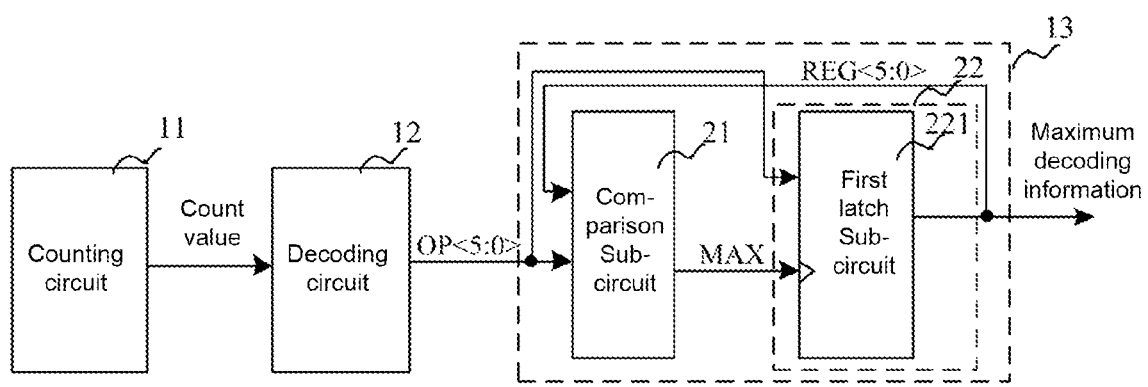
FIG. 13 is a schematic structural diagram of a counter circuit according to an embodiment.

In one example, FIG. 13 is a schematic structural diagram of a counter circuit according to an embodiment. As shown in FIG. 13, the first latch sub-circuit 22 includes a first latch 221. The first latch 221 has an input terminal connected to the decoding circuit 12, an enable terminal connected to the output terminal of the comparison sub-circuit 21, and an output terminal connected to a second input terminal of the comparison sub-circuit 21. In this example, the latch updates the latched decoding information or maintains the original decoding information in response to the valid or invalid enable signal, thereby always outputting the maximum decoding information on the basis of the simplified circuit.

Figure 14:
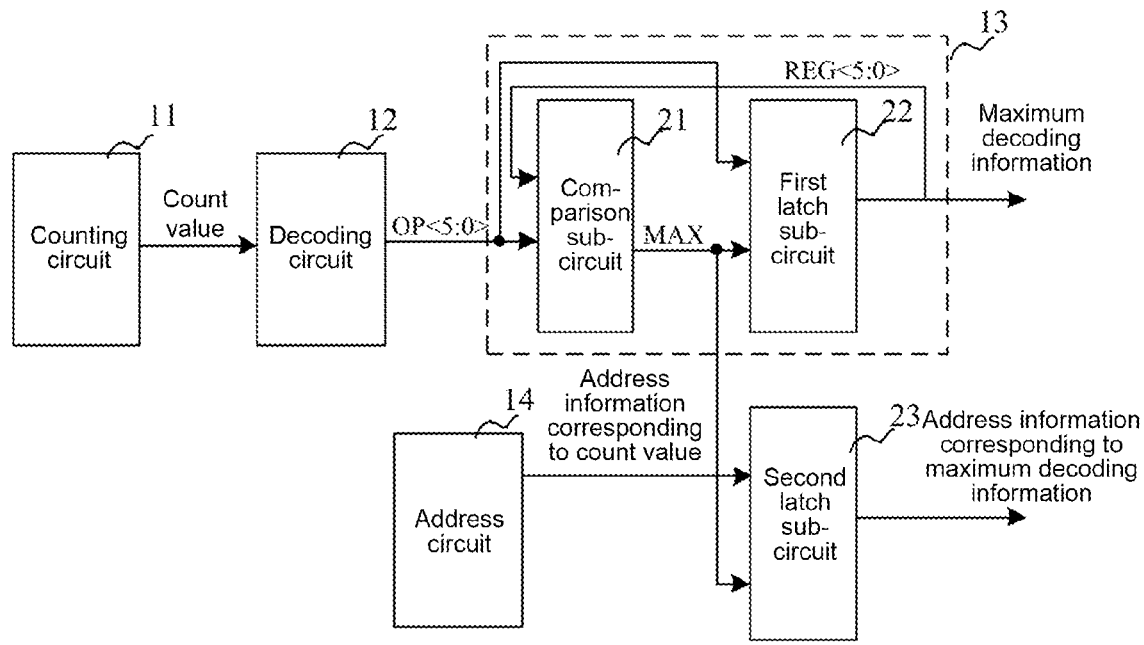
FIG. 14 is a schematic structural diagram of a counter circuit according to an embodiment.

Taking a scenario of EpRC as an example, the above count value is a number of row errors, and the historical maximum decoding information is decoding information corresponding to the historical maximum number of row errors. In view of the above introduction of the scenario of EpRC of the memory, in addition to recording the maximum number of row errors, it is also necessary to record address information corresponding to the maximum number of row errors. Therefore, in one example, as shown in FIG. 14, the circuit further includes an address circuit 14. The comparison circuit 13 further includes a second latch sub-circuit 23.

The address circuit 14 is configured to output the address information corresponding to the count value, where the address information includes, but is not limited to, a bank group address, a bank address, and a row address.

The second latch sub-circuit 23 has an input terminal connected to the address circuit 14 and an enable terminal connected to the output terminal of the comparison sub-circuit 21, and is configured to output, in response to the valid enable signal, the address information outputted by the address circuit 14, and maintain, in response to the invalid enable signal, the address information corresponding to the historical maximum number of row errors.

Specifically, whether the enable signal outputted by the comparison sub-circuit is valid is determined on the basis of the magnitude relationship between the decoding information outputted by the decoding circuit this time and the historical maximum decoding information in the first latch sub-circuit. In the scenario of EpRC of the memory, the enable signal is configured to control the first latch sub-circuit whether to update the latched number of errors, and further configured to control the second latch sub-circuit whether to update the row address information. As an example, the enable signal is valid, indicating that the decoding information this time is greater than the historical maximum decoding information. Therefore, when the maximum number of row errors is updated, the second latch sub-circuit updates, in response to the valid enable signal, the row address information corresponding to this decoding information outputted by the row address circuit this time, to the inside for latching and outputting, instead of the row address information corresponding to the historical maximum decoding information.

Arranging the row address circuit and the second latch sub-circuit can achieve the counting function of the maximum number of errors in the scenario of EpRC of the memory.

In the counter circuit provided in this embodiment, the counting circuit outputs the count value when the count value exceeds the predetermined threshold; the decoding circuit decodes the count value outputted by the counting circuit to obtain decoding information, which represents a numerical interval in which the count value is located; and the comparison circuit compares the decoding information with historical maximum decoding information, and latches and outputs current maximum decoding information. In this solution, the decoding circuit firstly decodes the current count value, and there is only one bit in the obtained decoding information, which indicates the numerical interval in which the count value is located. When the comparison circuit compares the decoding information corresponding to the current count value with the decoding information corresponding to the historical maximum count value, namely the historical maximum decoding information, the two are data having only one bit of 1. Therefore, the circuit structure of the comparison circuit can be greatly simplified. That is, the decoding information corresponding to a maximum count result can be determined and stored into a register. In this way, the maximum counting is implemented through a circuit having a more simplified structure, and the circuit can be well applicable to a counting scenario that needs to keep outputting a maximum result, namely, the scenario of EpRC.

Embodiment 2

Figure 15:
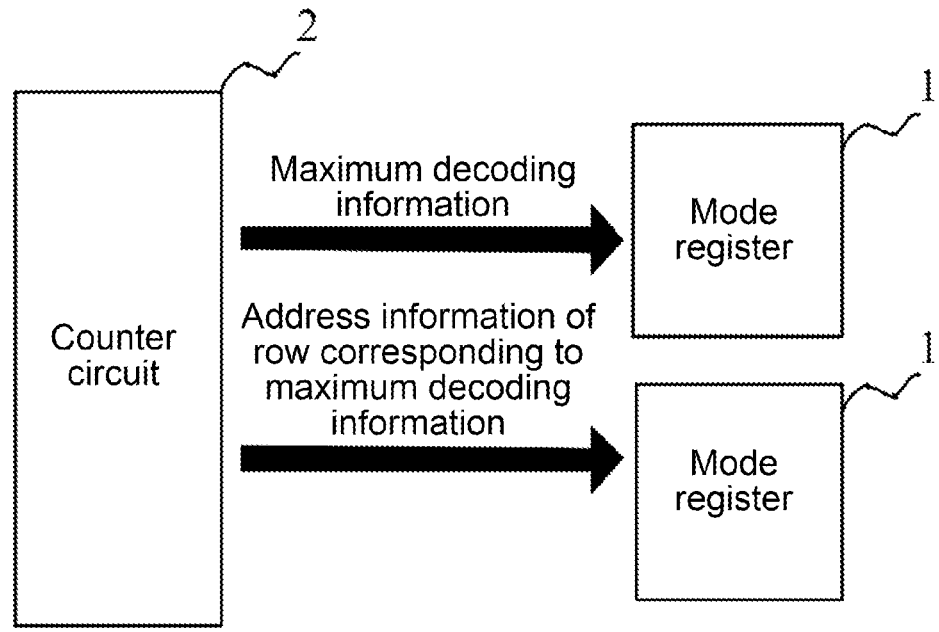
FIG. 15 is a schematic structural diagram of a memory according to an embodiment.

FIG. 15 is a schematic structural diagram of a memory according to an embodiment. As shown in FIG. 15, the memory includes a mode register 1 and the counter circuit 2 according to any of the above examples.

The mode register 1 is coupled to the counter circuit 2 and configured to save maximum decoding information outputted by the counter circuit 2.

As an example, the mode register 1 is further configured to save address information of a row corresponding to the maximum decoding information. In view of the solution of the above embodiment, taking the DRAM as an example: based on the above solution, the counter circuit decodes the number of row errors according to the detection situation of the current row when the number of row errors exceeds the predetermined threshold, and compares the decoding information obtained by decoding with the historical maximum decoding information. If the decoding information obtained this time is greater than the historical maximum decoding information, the decoding information this time is taken as the current maximum decoding information, or otherwise, the historical maximum decoding information is continuously taken as the maximum decoding information, until the detection of all rows ends, and the final maximum decoding information is obtained. The maximum decoding information represents a numerical interval where the maximum number of row errors is within. Correspondingly, the counter circuit does not need to decode the maximum decoding information again, and transmits same to a mode register configured to record the maximum number of row errors. In addition, the counter circuit further transmits, to the mode register configured to record the row address information corresponding to the maximum number of row errors, the address information of the row corresponding to the maximum decoding information, thereby realizing the scenario of EpRC of the memory.

In the memory provided in this embodiment, the counter circuit outputs a number of row errors when the number of row errors exceeds a predetermined threshold, decodes the number of row errors to obtain decoding information which represents a numerical interval in which the number of row errors is located, and compares the decoding information with historical maximum decoding information, and latches and outputs current maximum decoding information and address information of a corresponding row to a mode register. In this solution, the current count value is firstly decoded. By comparing the decoding information corresponding to the current number of row errors with the decoding information corresponding to the historical maximum count value, there is only one bit of 1 in the obtained decoding information, which indicates the numerical interval in which the count value is located. When the comparison circuit compares the decoding information corresponding to the current count value with the decoding information corresponding to the historical maximum count value, namely the historical maximum decoding information, the two are data having only one bit of 1. Therefore, the circuit structure of the comparison circuit can be greatly simplified. That is, the decoding information corresponding to a maximum count result can be determined and stored into a register. In this way, the maximum counting is implemented through a circuit having a more simplified structure, and the circuit can be well applicable to the scenario of EpRC.

Those skilled in the art may easily figure out other implementation solutions of the present disclosure after considering the specification and practicing the invention disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

It should be noted that the present disclosure is not limited to the precise structures described above and shown in the accompanying drawings, and can be modified and changed in many ways without departing from the scope of the present disclosure. The scope of the present disclosure is defined by the appended claims.

The invention claimed is:

1. A counter circuit, comprising:
a counting circuit, configured to output a count value when the count value exceeds a predetermined threshold;
a decoding circuit, coupled to the counting circuit, and configured to decode the count value to obtain decoding information corresponding to the count value, wherein the decoding information represents a numerical interval in which the count value is located; and
a comparison circuit, coupled to the decoding circuit, and configured to compare the decoding information with historical maximum decoding information and latch current maximum decoding information and output the current maximum decoding information;
wherein the decoding information is a multi-bit binary number, different bits of the decoding information correspond to different numerical intervals, and a numerical interval corresponding to a high bit is greater than a numerical interval corresponding to a low bit; and
wherein there is only one bit whose value is 1 in the decoding information, which indicates that the count value corresponding to the decoding information is within a numerical interval corresponding to the bit.

2. The circuit according to claim 1,
wherein the comparison circuit comprises a comparison sub-circuit and a first latch sub-circuit, wherein
the comparison sub-circuit has a first input terminal connected to the decoding circuit and a second input terminal connected to an output terminal of the first latch sub-circuit, and the comparison sub-circuit is configured to compare the decoding information with the historical maximum decoding information outputted by the first latch sub-circuit and output an enable signal based on a comparison result; and
the first latch sub-circuit has an input terminal connected to the decoding circuit and an enable terminal connected to an output terminal of the comparison sub-circuit, and the first latch sub-circuit is configured to latch the current maximum decoding information and output the current maximum decoding information in response to the enable signal.

3. The circuit according to claim 2, wherein the first latch sub-circuit comprises a first latch, wherein
the first latch has an input terminal connected to the decoding circuit, an enable terminal connected to the output terminal of the comparison sub-circuit, and an output terminal connected to the second input terminal of the comparison sub-circuit.

4. The circuit according to claim 2, wherein the count value is a number of row errors, and the historical maximum decoding information is decoding information corresponding to a historical maximum number of row errors; wherein the decoding information is a six-bit binary number;
the circuit further comprising an address circuit, wherein the comparison circuit further comprises a second latch sub-circuit;

the address circuit is configured to output address information corresponding to the count value; and
the second latch sub-circuit has an input terminal connected to the address circuit and an enable terminal connected to the output terminal of the comparison sub-circuit, and the second latch sub-circuit is configured to output, in response to a valid enable signal, the address information outputted by the address circuit, and maintain, in response to an invalid enable signal, the address information corresponding to the historical maximum number of row errors; wherein the address information comprises a bank group address, a bank address, and a row address.

5. The circuit according to claim 1, wherein the decoding circuit comprises a one-hot decoder.

6. A memory, comprising a mode register and the counter circuit according to claim 1, wherein
the mode register is coupled to the counter circuit and configured to save maximum decoding information outputted by the counter circuit.

7. A counter circuit, comprising:
a counting circuit, configured to output a count value when the count value exceeds a predetermined threshold;
a decoding circuit, coupled to the counting circuit, and configured to decode the count value to obtain decoding information corresponding to the count value, wherein the decoding information represents a numerical interval in which the count value is located; and
a comparison circuit, coupled to the decoding circuit, and configured to compare the decoding information with historical maximum decoding information and latch current maximum decoding information and output the current maximum decoding information;
wherein the comparison circuit comprises a comparison sub-circuit and a first latch sub-circuit;
wherein the comparison sub-circuit has a first input terminal connected to the decoding circuit and a second input terminal connected to an output terminal of the first latch sub-circuit, and the comparison sub-circuit is configured to compare the decoding information with the historical maximum decoding information outputted by the first latch sub-circuit and output an enable signal based on a comparison result;
wherein the first latch sub-circuit has an input terminal connected to the decoding circuit and an enable terminal connected to an output terminal of the comparison sub-circuit, and the first latch sub-circuit is configured to latch the current maximum decoding information and output the current maximum decoding information in response to the enable signal;
wherein the comparison sub-circuit is configured to output a valid enable signal when the decoding information is greater than the historical maximum decoding information outputted by the first latch sub-circuit, and output an invalid enable signal when the decoding information is not greater than the historical maximum decoding information outputted by the first latch sub-circuit; and
wherein the first latch sub-circuit is configured to latch and output, in response to the valid enable signal, the decoding information outputted by the decoding circuit, and maintain-4e outputting the historical maximum decoding information in response to the invalid enable signal.

8. The circuit according to claim 7, wherein the comparison sub-circuit comprises a plurality of comparators and an output sub-circuit, wherein the plurality of comparators are in one-to-one correspondence with bits in the decoding information;
- each of the plurality of comparators is configured to receive a corresponding bit signal and a corresponding characteristic signal in the decoding information, and output a result signal based on a comparison result between the bit signal and the characteristic signal, wherein a value of the characteristic signal indicates whether a bit having a value of 1 and not lower than corresponding bit of the comparator exists in the historical maximum decoding information; and
- the output sub-circuit is configured to determine and output the valid enable signal or the invalid enable signal based on the result signal outputted by each of the plurality of comparators.

9. The circuit according to claim 8, wherein
the output sub-circuit is configured to output the valid enable signal in response to the result signal outputted by any one of the plurality of comparator being a first value, wherein the first value indicates that a value of the corresponding bit signal in the decoding information received by the comparator is 1 and values of bits in the historical maximum decoding information and not lower than the bit are all 0.

10. The circuit according to claim 9, wherein each of the plurality of comparators comprises a first NOT gate and a first NOR gate, wherein
- the first NOT gate has an input terminal configured to receive the corresponding bit signal in the decoding information and an output terminal connected to a first input terminal of the first NOR gate; and
- the first NOR gate has a second input terminal configured to receive the characteristic signal corresponding to the comparator and an output terminal connected to the output sub-circuit.

11. The circuit according to claim 9, wherein the output sub-circuit comprises a plurality of fourth NOR gates and a first NAND gate, wherein
- each of the plurality of fourth NOR gates has input terminals connected to output terminals of the comparator corresponding to adjacent bits in the decoding information and an output terminal connected to an input terminal of the first NAND gate, and an output terminal of the first NAND gate is configured to output the enable signal.

12. The circuit according to claim 8, wherein there is one characteristic signal corresponding to each of the plurality of comparators.

13. The circuit according to claim 12, wherein each of the plurality of comparators further comprises a first signal generator, wherein
the first signal generator has input terminals configured to receive all bit signals in the historical maximum decoding information and not lower than corresponding bit of the comparator, and the first signal generator is configured to output a characteristic signal having a value of 1 in response to a value of any one of received bit signals being 1.

14. The circuit according to claim 13, wherein the first signal generator comprises at least one first generator, wherein
- each of the at least one first generators comprises a second NOR gate and a second NOT gate, wherein the second NOR gate has an input terminal as an input terminal of the first generator and an output terminal connected to an input terminal of the second NOT gate, and an output terminal of the second NOT gate serves as an output terminal of the first generator;
- input terminals of each of the at least one first generators are connected to some or all bits in the historical maximum decoding information and not lower than the corresponding bit of the comparator, and a combination result of all bits connected to the first generators comprises all the bits in the historical maximum decoding information and not lower than the corresponding bit of the comparator; and
- each of the at least one first generators other than a first one is connected to an output terminal of the first generator of a previous stage, and the first generator of a last stage outputs the characteristic signal.

15. The circuit according to claim 8, wherein there are a plurality of characteristic signals corresponding to at least one of the plurality of comparator.

16. The circuit according to claim 15, wherein the comparison sub-circuit further comprises a second signal generator, wherein
the second signal generator is configured to output a corresponding characteristic signal according to whether a bit having a value of 1 and not lower than a predetermined bit exists in the historical maximum decoding information.

17. The circuit according to claim 16, wherein each of the plurality of comparator comprise a first comparator and a second comparator, wherein
- a characteristic signal corresponding to the first comparator comprises all bit signals in the historical maximum decoding information and not lower than bit corresponding to the first comparator; and
- a characteristic signal corresponding to the second comparator comprises a signal outputted by the second signal generator, wherein the predetermined bit is a bit corresponding to the second comparator in the decoding information.

18. The circuit according to claim 16, wherein each of the plurality of comparator comprise a third comparator, wherein
a characteristic signal corresponding to the third comparator comprises the corresponding characteristic signal outputted by the second signal generator and bit signal corresponding to the third comparator in the historical maximum decoding information, wherein the predetermined bit is a higher bit adjacent to a bit corresponding to the third comparator in the decoding information.

19. A memory, comprising a mode register and the counter circuit according to claim 7, wherein
the mode register is coupled to the counter circuit and configured to save maximum decoding information outputted by the counter circuit.

20. A counter circuit, comprising:
- a counting circuit, configured to output a count value when the count value exceeds a predetermined threshold;
- a decoding circuit, coupled to the counting circuit, and configured to decode the count value to obtain decoding information corresponding to the count value, wherein the decoding information represents a numerical interval in which the count value is located; and
- a comparison circuit, coupled to the decoding circuit, and configured to compare the decoding information with historical maximum decoding information and latch current maximum decoding information and output the current maximum decoding information;

wherein the comparison circuit comprises a comparison sub-circuit and a first latch sub-circuit;

wherein the comparison sub-circuit has a first input terminal connected to the decoding circuit and a second input terminal connected to an output terminal of the first latch sub-circuit, and the comparison sub-circuit is configured to compare the decoding information with the historical maximum decoding information outputted by the first latch sub-circuit and output an enable signal based on a comparison result;

wherein the first latch sub-circuit has an input terminal connected to the decoding circuit and an enable terminal connected to an output terminal of the comparison sub-circuit, and the first latch sub-circuit is configured to latch the current maximum decoding information and output the current maximum decoding information in response to the enable signal;

wherein the count value is a number of row errors, and the historical maximum decoding information is decoding information corresponding to a historical maximum number of row errors; wherein the decoding information is a six-bit binary number;

wherein the circuit further comprising an address circuit, wherein the comparison circuit further comprises a second latch sub-circuit;

wherein the address circuit is configured to output address information corresponding to the count value; and wherein the second latch sub-circuit has an input terminal connected to the address circuit and an enable terminal connected to the output terminal of the comparison sub-circuit, and the second latch sub-circuit is configured to output, in response to a valid enable signal, the address information outputted by the address circuit, and maintain, in response to an invalid enable signal, the address information corresponding to the historical maximum number of row errors; wherein the address information comprises a bank group address, a bank address, and a row address.

\* \* \* \* \*